United States Patent
Park et al.

(10) Patent No.: US 11,639,438 B2
(45) Date of Patent: May 2, 2023

(54) EPOXY RESIN COMPOSITION FOR ENCAPSULATING SEMICONDUCTOR DEVICE AND SEMICONDUCTOR DEVICE ENCAPSULATED USING THE SAME

(71) Applicant: SAMSUNG SDI CO., LTD., Yongin-si (KR)

(72) Inventors: Yong Yeop Park, Suwon-si (KR); Dong Hwan Lee, Suwon-si (KR); Kyoung Chui Bae, Suwon-si (KR); Min Joon Seo, Suwon-si (KR); Chui Ho Lee, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 24 days.

(21) Appl. No.: 17/479,259

(22) Filed: Sep. 20, 2021

(65) Prior Publication Data
US 2022/0145066 A1    May 12, 2022

(30) Foreign Application Priority Data
Nov. 6, 2020 (KR) .................. 10-2020-0148137

(51) Int. Cl.
| C08L 63/00 | (2006.01) |
| C08G 59/22 | (2006.01) |
| C08K 3/22  | (2006.01) |
| C08G 59/68 | (2006.01) |
| C08G 59/42 | (2006.01) |
| C08G 59/12 | (2006.01) |
| C08G 59/62 | (2006.01) |

(52) U.S. Cl.
CPC .............. *C08L 63/00* (2013.01); *C08G 59/12* (2013.01); *C08G 59/22* (2013.01); *C08G 59/4269* (2013.01); *C08G 59/621* (2013.01); *C08G 59/688* (2013.01); *C08K 3/22* (2013.01); *C08K 2003/2227* (2013.01); *C08L 2203/206* (2013.01)

(58) Field of Classification Search
CPC ................ C08G 59/12; C08L 63/00
See application file for complete search history.

(56) References Cited

U.S. PATENT DOCUMENTS

| | | | | |
|---|---|---|---|---|
| 3,714,198 A * | 1/1973 | Metzger et al. | ....... | C08G 59/12 560/127 |
| 4,997,907 A * | 3/1991 | Marten | .................. | C08G 59/12 528/297 |
| 5,294,463 A * | 3/1994 | Le Barny | ............... | C08G 59/28 528/229 |
| 5,364,912 A * | 11/1994 | Hefner, Jr. | ......... | C09K 19/3823 528/96 |
| 5,948,514 A * | 9/1999 | Komori | ................ | G03F 7/0388 428/209 |
| 2003/0004281 A1* | 1/2003 | Smits | ..................... | C08G 59/12 525/448 |
| 2007/0031650 A1* | 2/2007 | Kobayashi | .............. | B32B 27/36 428/323 |
| 2012/0251955 A1* | 10/2012 | Sakamoto | .......... | C08G 59/4223 430/296 |
| 2016/0289518 A1* | 10/2016 | Zupancic | ................ | C08G 59/50 |
| 2017/0028526 A1* | 2/2017 | Wasilczyk | ........ | C08G 18/4854 |
| 2017/0158807 A1* | 6/2017 | Yoshimoto | ............... | C08K 9/08 |
| 2021/0403635 A1* | 12/2021 | Endo | ....................... | G03F 7/094 |

FOREIGN PATENT DOCUMENTS

| TW | 200831597 A | 8/2008 |
| TW | 201127865 A | 8/2011 |
| TW | 201612231 A | 4/2016 |

OTHER PUBLICATIONS

Taiwanese Office action dated Nov. 8, 2022.

\* cited by examiner

*Primary Examiner* — Megan McCulley
(74) *Attorney, Agent, or Firm* — Lee IP Law, P.C.

(57) ABSTRACT

An epoxy resin composition for encapsulation of semiconductor devices and a semiconductor device encapsulated using the epoxy resin composition, the epoxy resin composition including an epoxy resin; a curing agent; an inorganic filler; and a curing catalyst, the epoxy resin including an epoxy resin represented by Formula 1:

[Formula 1]

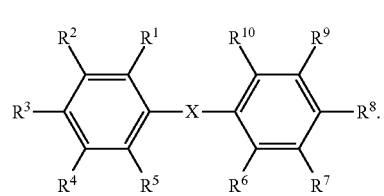

7 Claims, No Drawings

EPOXY RESIN COMPOSITION FOR ENCAPSULATING SEMICONDUCTOR DEVICE AND SEMICONDUCTOR DEVICE ENCAPSULATED USING THE SAME

CROSS-REFERENCE TO RELATED APPLICATION

This application claims the benefit of Korean Patent Application No. 10-2020-0148137, filed on Nov. 6, 2020 in the Korean Intellectual Property Office, the entire disclosure of which is incorporated herein by reference.

BACKGROUND

1. Field

Embodiments relate to an epoxy resin composition for encapsulation of semiconductor devices and a semiconductor device encapsulated using the same.

2. Description of the Related Art

Recently, the degree of integration of semiconductor devices has been improved.

SUMMARY

The embodiments may be realized by providing an epoxy resin composition for encapsulation of semiconductor devices, the epoxy resin composition including an epoxy resin; a curing agent; an inorganic filler; and a curing catalyst, wherein the epoxy resin includes an epoxy resin represented by Formula 1:

[Formula 1]

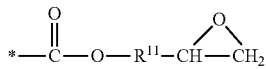

in Formula 1, X is O, S, C(=O), a substituted or unsubstituted $C_1$ to $C_5$ alkylene group, or NH; one of $R^1$, $R^2$, $R^3$, $R^4$, and $R^5$ is a group represented by Formula 2, and remaining ones of $R^1$, $R^2$, $R^3$, $R^4$, and $R^5$ are each independently hydrogen, a halogen, an amino group (—$NH_2$), a cyano group (—CN), a hydroxyl group (—OH), a substituted or unsubstituted $C_1$ to $C_{20}$ alkyl group, a substituted or unsubstituted $C_3$ to $C_{20}$ cycloalkyl group, a substituted or unsubstituted $C_6$ to $C_{20}$ aryl group, or a substituted or unsubstituted $C_7$ to $C_{20}$ arylalkyl group; one of $R^6$, $R^7$, $R^8$, $R^9$, and $R^{10}$ is a group represented by Formula 2, remaining ones of $R^6$, $R^7$, $R^8$, $R^9$, and $R^{10}$ are each independently hydrogen, a halogen, an amino group, a cyano group, a hydroxyl group, a substituted or unsubstituted $C_1$ to $C_{20}$ alkyl group, a substituted or unsubstituted $C_3$ to $C_{20}$ cycloalkyl group, a substituted or unsubstituted $C_6$ to $C_{20}$ aryl group, or a substituted or unsubstituted $C_7$ to $C_{20}$ arylalkyl group,

[Formula 2]

$$*-\overset{O}{\underset{\|}{C}}-O-R^{11}-\overset{O}{\underset{\triangle}{CH-CH_2}}$$

in Formula 2, * is a linking site, and $R^{11}$ is a substituted or unsubstituted $C_1$ to $C_{10}$ alkylene group.

The epoxy resin represented by Formula 1 may be represented by Formula 1-1, Formula 1-2, or Formula 1-3:

[Formula 1-1]

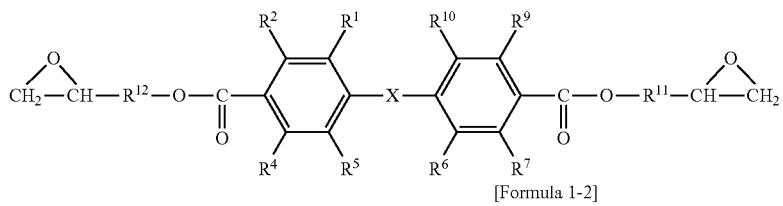

[Formula 1-2]

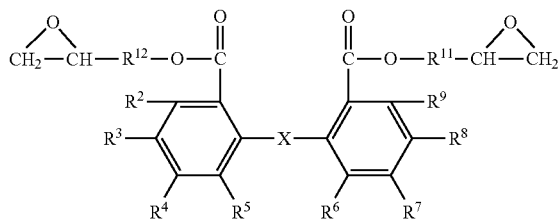

[Formula 1-3]

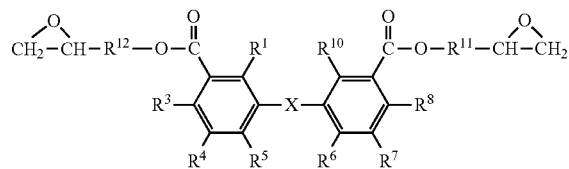

in Formulae 1-1, 1-2, and 1-3, X is defined the same as that of Formula 1; $R^{11}$ and $R^{12}$ are each independently a substituted or unsubstituted $C_1$ to $C_{10}$ alkylene group; and $R^1$, $R^2$, $R^3$, $R^4$, $R^5$, $R^6$, $R^7$, $R^8$, $R^9$, and $R^{10}$ are each independently hydrogen, a halogen, an amino group, a cyano group, a hydroxyl group, a substituted or unsubstituted $C_1$ to $C_{20}$ alkyl group, a substituted or unsubstituted $C_3$ to $C_{20}$ cycloalkyl group, a substituted or unsubstituted $C_6$ to $C_{20}$ aryl group, or a substituted or unsubstituted $C_7$ to $C_{20}$ arylalkyl group.

In Formulae 1-1, 1-2, and 1-3, $R^1$, $R^2$, $R^3$, $R^4$, $R^5$, $R^6$, $R^7$, $R^8$, $R^9$, and $R^{10}$ may each independently be hydrogen or a substituted or unsubstituted $C_1$ to $C_3$ alkyl group.

The epoxy resin represented by Formula 1 may be present in the epoxy resin composition in an amount of about 2 wt % to about 17 wt %, based on a total weight of the epoxy resin composition.

The inorganic filler may include alumina.

The epoxy resin composition may include about 2 wt % to about 17 wt % of the epoxy resin; about 0.5 wt % to about 13 wt % of the curing agent; about 70 wt % to about 95 wt % of the inorganic filler; and about 0.01 wt % to about 5 wt % of the curing catalyst, all wt % being based on a total weight of the epoxy resin composition.

The embodiments may be realized by providing a semiconductor device encapsulated using the epoxy resin composition for encapsulation of semiconductor devices according to an embodiment.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

As used herein to represent a specific numerical range, the expression "X to Y" means "greater than or equal to X and less than or equal to Y". As used herein, the term "or" is not an exclusive term, e.g., "A or B" would include A, B, or A and B.

As used herein, unless otherwise stated, the term "substituted" in the expression "substituted or unsubstituted" means that at least one hydrogen atom of a corresponding functional group is substituted with a hydroxyl group, an amino group, a nitro group, a cyano group, a $C_1$ to $C_{20}$ alkyl group, a $C_1$ to $C_{20}$ haloalkyl group, a $C_6$ to $C_{30}$ aryl group, a $C_3$ to $C_{30}$ heteroaryl group, a $C_3$ to $C_{10}$ cycloalkyl group, a $C_3$ to $C_{10}$ heterocycloalkyl group, a $C_7$ to $C_{30}$ arylalkyl group, or a $C_1$ to $C_{30}$ heteroalkyl group.

In order to impart high thermal conductivity to an epoxy resin composition for encapsulation of semiconductor devices, a relatively large quantity of inorganic filler may be used. Using an inorganic filler in large quantities could cause increase in viscosity of the composition and reduction in fluidity of the composition, which could result in difficulty in formation of a semiconductor package. In order to address such issues, use of alumina, which is an inorganic filler having relatively high thermal conductivity, may be considered. An epoxy resin included in the composition may have a very low thermal conductivity of about 0.2 W/m·K, and there may be a limit to increasing thermal conductivity of the composition using alumina.

An epoxy resin composition for encapsulation of semiconductor devices according to an embodiment may include, e.g., an epoxy resin, a curing agent, an inorganic filler, and a curing catalyst. In an implementation, the epoxy resin may include an epoxy resin represented by Formula 1, below. The epoxy resin represented by Formula 1 may have high thermal conductivity, thereby improving heat dissipation properties of the composition, while exhibiting good fluidity.

Epoxy Resin

The epoxy resin may include an epoxy resin represented by Formula 1. The epoxy resin represented by Formula 1 may help significantly improve heat dissipation properties of the composition, e.g., due to high thermal conductivity thereof, and may help improve processability of the composition, e.g., due to good fluidity thereof.

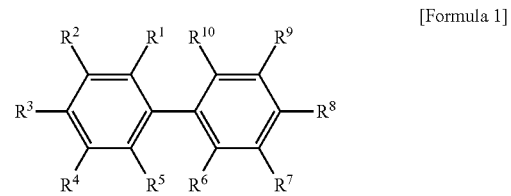

[Formula 1]

In Formula 1, X may be, e.g., O, S, C(=O), a substituted or unsubstituted $C_1$ to $C_5$ alkylene group, or NH.

One of $R^1$, $R^2$, $R^3$, $R^4$, and $R^5$ may be, e.g., a group represented by Formula 2, below. The others or remaining ones of $R^1$, $R^2$, $R^3$, $R^4$, and $R^5$ may each independently be or include, e.g., hydrogen, a halogen, an amino group (—$NH_2$), a cyano group (—CN), a hydroxyl group (—OH), a substituted or unsubstituted $C_1$ to $C_{20}$ alkyl group, a substituted or unsubstituted $C_3$ to $C_{20}$ cycloalkyl group, a substituted or unsubstituted $C_6$ to $C_{20}$ aryl group, or a substituted or unsubstituted $C_7$ to $C_{20}$ arylalkyl group.

One of $R^6$, $R^7$, $R^8$, $R^9$, and $R^{10}$ may be, e.g., a group represented by Formula 2. The others or remaining ones of $R^6$, $R^7$, $R^8$, $R^9$, and $R^{10}$ may each independently be or include, e.g., hydrogen, a halogen, an amino group, a cyano group, a hydroxyl group, a substituted or unsubstituted $C_1$ to $C_{20}$ alkyl group, a substituted or unsubstituted $C_3$ to $C_{20}$ cycloalkyl group, a substituted or unsubstituted $C_6$ to $C_{20}$ aryl group, or a substituted or unsubstituted $C_7$ to $C_{20}$ arylalkyl group.

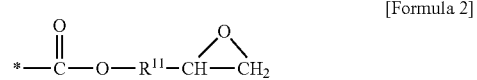

[Formula 2]

In Formula 2, * is a linking point or linking site between elements. $R^{11}$ may be or may include, e.g., a substituted or unsubstituted $C_1$ to $C_{10}$ alkylene group.

In an implementation, X may be, e.g., O or S. In an implementation, X may be, e.g., O.

In an implementation, one of $R^1$, $R^2$, $R^3$, $R^4$, and $R^5$ may be, e.g., a functional group represented by Formula 2, and the others may each independently be, e.g., hydrogen or a substituted or unsubstituted $C_1$ to $C_{10}$ alkyl group. In an implementation, the remaining ones of $R^1$, $R^2$, $R^3$, $R^4$, and $R^5$ may each independently be, e.g., hydrogen or a substituted or unsubstituted $C_1$ to $C_3$ alkyl group.

In an implementation, one of $R^6$, $R^7$, $R^8$, $R^9$, and $R^{10}$ may be, e.g., a functional group represented by Formula 2, and the others may each independently be, e.g., hydrogen or a substituted or unsubstituted $C_1$ to $C_{10}$ alkyl group. In an implementation, the remaining ones of $R^6$, $R^7$, $R^8$, $R^9$, and $R^{10}$ may each independently be, e.g., hydrogen or a substituted or unsubstituted $C_1$ to $C_3$ alkyl group.

In an implementation, $R^{11}$ may be, e.g., a substituted or unsubstituted $C_1$ to $C_5$ alkylene group. In an implementation, $R^{11}$ may be, e.g., a substituted or unsubstituted $C_1$ to $C_3$ alkylene group.

In an implementation, the epoxy resin represented by Formula 1 may be represented by Formula 1-1, Formula 1-2, or Formula 1-3.

[Formula 1-1]

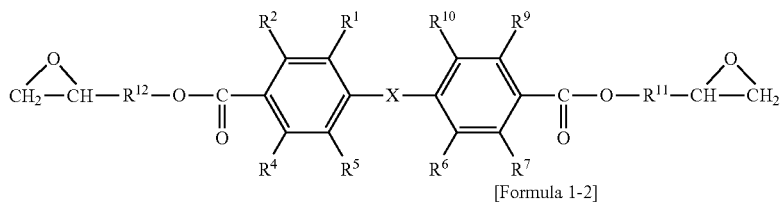

[Formula 1-2]

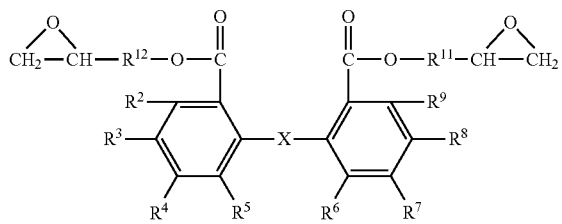

[Formula 1-3]

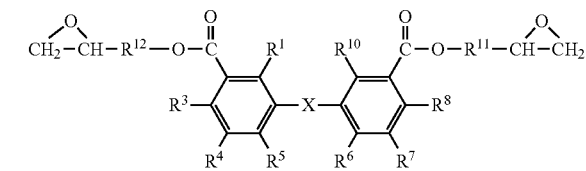

In Formulae 1-1, 1-2, and 1-3, X may be defined the same as that of Formula 1.

$R^{11}$ and $R^{12}$ may each independently be, e.g., a substituted or unsubstituted $C_1$ to $C_{10}$ alkylene group.

$R^1$, $R^2$, $R^3$, $R^4$, $R^5$, $R^6$, $R^7$, $R^8$, $R^9$, and $R^{10}$ may each independently be, e.g., hydrogen, a halogen, an amino group, a cyano group, a hydroxyl group, a substituted or unsubstituted $C_1$ to $C_{20}$ alkyl group, a substituted or unsubstituted $C_3$ to $C_{20}$ cycloalkyl group, a substituted or unsubstituted $C_6$ to $C_{20}$ aryl group, or a substituted or unsubstituted $C_7$ to $C_{20}$ arylalkyl group.

In an implementation, in Formulae 1-1, 1-2, and 1-3, $R^1$, $R^2$, $R^3$, $R^4$, $R^5$, $R^6$, $R^7$, $R^8$, $R^9$, and $R^{10}$ may each independently be, e.g., hydrogen or a substituted or unsubstituted $C_1$ to $C_3$ alkyl group.

As the epoxy resin represented by Formula 1, Formulae 1-1, 1-2, and 1-3 may be used alone or in combination thereof in the epoxy resin composition. In an implementation, the epoxy resin represented by Formula 1 may be present in the epoxy resin composition in an amount of, e.g., about 2 wt % to about 17 wt % (e.g., 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, or 17 wt %), or 2 wt % to 10 wt % (e.g., all wt % being based on a total weight of the composition). Within this range, the epoxy resin may help improve heat dissipation properties of the composition without a reduction in curability of the composition.

The epoxy resin represented by Formula 1 may be prepared by a suitable method. In an implementation, the epoxy resin represented by Formula 1 may be prepared by, e.g., reacting a compound represented by Formula 4 with a dicarboxylic compound which is substantially the same as the epoxy resin represented by Formula 1 except that one of $R^1$, $R^2$, $R^3$, $R^4$, and $R^5$ is a group represented by Formula 3 and one of $R^6$, $R^7$, $R^8$, $R^9$, and $R^{10}$ is a group represented by Formula 3.

[Formula 3]

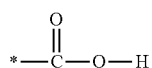

In Formula 3, * is a linking point.

[Formula 4]

$$Y-R^{11}-\overset{O}{\overset{\diagup\diagdown}{CH-CH_2}}$$

In Formula 4, Y may be, e.g., a halogen, and $R^{11}$ may be defined the same as that of Formula 2.

In an implementation, the epoxy resin may further include an epoxy resin other than the epoxy resin represented by Formula 1. For convenience, the epoxy resin represented by Formula 1 may be referred to as a "first epoxy resin" and the epoxy resin other than the epoxy resin represented by Formula 1 may be referred to as a "second epoxy resin".

The second epoxy resin may include at least two epoxy groups per molecule, and may include, e.g., bisphenol A epoxy resins, bisphenol F epoxy resins, phenol novolac epoxy resins, tert-butyl catechol epoxy resins, naphthalene epoxy resins, glycidyl amine epoxy resins, cresol novolac epoxy resins, biphenyl epoxy resins, phenol aralkyl epoxy resins, linear aliphatic epoxy resins, alicyclic epoxy resins, heterocyclic epoxy resins, spirocyclic epoxy resins, cyclohexanedimethanol epoxy resins, trimethylol epoxy resins, halogenated epoxy resins, or the like. As the second epoxy resin, these epoxy resins may be used alone or as a mixture thereof.

In an implementation epoxy resin may be present in the epoxy resin composition in an amount of, e.g., about 2 wt % to about 17 wt % (e.g., 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, or 17 wt %), or 2 wt % to 10 wt %. Within this range, a reduction in curability of the composition may be avoided.

Curing Agent

The curing agent may include, e.g., polyhydric phenol compounds such as polyfunctional phenol resins, phenol aralkyl resins, phenol novolac resins, Xylok phenol resins, cresol novolac phenol resins, naphthol phenol resins, terpene phenol resins, dicyclopentadiene phenol resins, novolac phenol resins synthesized from bisphenol A and resol, tris(hydroxyphenyl)methane, and dihydroxybiphenyl; acid anhydrides such as maleic anhydride and phthalic anhydride; or aromatic amines such as metaphenylenediamine, diaminodiphenylmethane, and diaminodiphenylsulfone. In an implementation, the curing agent may be, e.g., a Xylok phenol resin or a phenol aralkyl resin.

The curing agent may be present in the epoxy resin composition in an amount of, e.g., about 0.5 wt % to about 13 wt % (e.g., 0.5 wt %, 0.6 wt %, 0.7 wt %, 0.8 wt %, 0.9 wt %, 1 wt %, 2 wt %, 3 wt %, 4 wt %, 5 wt %, 6 wt %, 7 wt %, 8 wt %, 9 wt %, 10 wt %, 11 wt %, 12 wt %, or 13 wt %). Within this range, a reduction in curability of the composition may be avoided.

Inorganic Filler

The inorganic filler may help improve mechanical properties of the epoxy resin composition while reducing stress in the epoxy resin composition. In addition, the inorganic filler according an embodiment may help increase thermal conductivity and improve heat dissipation properties of the epoxy resin composition, may help improve fluidity of the epoxy resin composition, and may help reduce thermal expansion and moisture absorption of the epoxy resin composition.

The inorganic filler may include, e.g., fused silica, crystalline silica, calcium carbonate, magnesium carbonate, alumina, magnesia, clay, talc, calcium silicate, titanium oxide, antimony oxide, or glass fibers.

In an implementation, the inorganic filler may include, e.g., alumina. The alumina has a thermal conductivity of about 25 W/m·K to 30 W/m·K and may easily increase thermal conductivity of the composition.

In an implementation, the alumina may have, e.g., a spherical or aspherical shape. When the alumina has a spherical shape, the alumina may help improve fluidity of the composition. The alumina may have an average particle diameter ($D_{50}$) of, e.g., about 0.5 μm to about 50 μm, or about 0.5 μm to about 30 μm. Within this range, the composition may have good properties in terms of fluidity and thermal conductivity. In an implementation, the alumina may include a mixture of two types of alumina having different average particle diameters ($D_{50}$). In an implementation, the alumina may be a mixture in which a first type of alumina and a second type of alumina are present in a weight ratio of about 1:1 to about 10:1, wherein the first type of alumina may have a greater average particle diameter ($D_{50}$) than the second type of alumina. The alumina may be coated with the epoxy resin or the curing agent prior to being incorporated into the composition, as desired.

The amount of the inorganic filler in the composition may vary depending on properties required for the composition, e.g., thermal conductivity, moldability, reduced internal stress, or strength at high temperatures. In an implementation, the inorganic filler may be present in the epoxy resin composition in an amount of, e.g., about 70 wt % to about 95 wt % (e.g., 70 wt %, 71 wt %, 72 wt %, 73 wt %, 74 wt %, 75 wt %, 76 wt %, 77 wt %, 78 wt %, 79 wt %, 80 wt %, 81 wt %, 82 wt %, 83 wt %, 84 wt %, 85 wt %, 86 wt %, 87 wt %, 88 wt %, 89 wt %, 90 wt %, 91 wt %, 92 wt %, 93 wt %, 94 wt %, or 95 wt %). Within this range, the inorganic filler may help secure flame retardancy, fluidity, and reliability of the epoxy resin composition.

Curing Catalyst

The curing catalyst may include, e.g., tertiary amines, organometallic compounds, organophosphorus compounds, imidazole compounds, or boron compounds. Examples of the tertiary amine may include benzyldimethylamine, triethanolamine, triethylenediamine, diethylaminoethanol, tri(dimethylaminomethyl)phenol, 2,2-(dimethylaminomethyl)phenol, 2,4,6-tris(diaminomethyl)phenol, and tri-2-ethyl hexanoate. Examples of the organometallic compound may include chromium acetylacetonate, zinc acetylacetonate, and nickel acetylacetonate. Examples of the organophosphorus compound may include triphenylphosphine, tris-4-methoxyphosphine, triphenylphosphine-triphenylborane, and triphenylphosphine-1,4-benzoquinone adducts. Examples of the imidazole compound may include 2-methylimidazole, 2-phenylimidazole, 2-aminoimidazole, 2-methyl-1-vinylimidazole, 2-ethyl-4-methylimidazole, and 2-heptadecyl imidazole. Examples of the boron compound may include triphenylphosphine tetraphenyl borate, tetraphenylboron salts, trifluoroborane-n-hexylamine, trifluoroborane monoethylamine, tetrafluoroborane triethylamine, and tetrafluoroborane amine. In an implementation, 1,5-diazabicyclo[4.3.0]non-5-ene (DBN), 1,8-diazabicyclo[5.4.0]undec-7-ene (DBU), and a phenol novolac resin salt may be used as the curing catalyst.

The curing catalyst may be used in the form of an adduct prepared by pre-reacting the curing catalyst with the epoxy resin or the curing agent.

The curing catalyst may be present in the epoxy resin composition in an amount of, e.g., about 0.01 wt % to about 5 wt % (e.g., 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, 0.2 wt %, 0.3 wt %, 0.4 wt %, 0.5 wt %, 0.6 wt %, 0.7 wt %, 0.8 wt %, 0.9 wt %, 1 wt %, 2 wt %, 3 wt %, 4 wt %, or 5 wt %). Within this range, the curing catalyst may help secure fluidity of the composition while preventing delay in curing of the composition.

In an implementation, the epoxy resin composition may further include a suitable additive that can be used in epoxy resin compositions for encapsulation of semiconductor devices. In an implementation, the additive may include, e.g., a coupling agent, a release agent, a colorant, a stress reliever, a crosslinking enhancer, or a leveling agent.

The coupling agent may help increase interfacial strength between the epoxy resin and the inorganic filler through reaction with the epoxy resin and the inorganic filler, and may include, e.g., a silane coupling agent. In an implementation, the silane coupling agent may include a suitable silane coupling agent that can increase interfacial strength between the epoxy resin and the inorganic filler through reaction with the epoxy resin and the inorganic filler. Examples of the silane coupling agent may include epoxy silane, amino silane, ureido silane, mercapto silane, and alkyl silane. These may be used alone or in combination thereof. The coupling agent may be present in an amount of, e.g., about 0.01 wt % to about 5 wt %, or about 0.05 wt % to about 3 wt %, in the epoxy resin composition for encapsulation of semiconductor devices. Within this range, a cured product of the epoxy resin composition may have increased strength.

The release agent may include, e.g., paraffin wax, ester wax, higher fatty acid, metallic salts of higher fatty acid, natural fatty acid, or metallic salts of natural fatty acid. The release agent may be present in an amount of, e.g., about 0.1 wt % to about 1 wt %, in the epoxy resin composition.

The colorant may include, e.g., carbon black. The colorant may be present in an amount of, e.g., about 0.1 wt % to 1 wt %, in the epoxy resin composition.

The stress reliever may include, e.g., modified silicone oils, silicone elastomers, silicone powders, and silicone resins. In an implementation, the stress reliever may be present in an amount of, e.g., about 2 wt % or less, about 1 wt % or less, or about 0.1 wt % to about 1 wt %, in the epoxy resin composition.

In an implementation, the additive may be present in an amount of, e.g., about 0.1 wt % to about 5 wt %, or about 0.1 wt % to about 3 wt %, in the epoxy resin composition.

In an implementation, the epoxy resin composition may be prepared through a process in which the aforementioned components are uniformly mixed in a Henschel mixer or a Lödige mixer, followed by melt-kneading in a roll mill or a kneader at about 90° C. to about 120° C., and then the resultant may be subjected to cooling and pulverization.

A semiconductor device according to an embodiment may be encapsulated using the epoxy resin composition for encapsulation of semiconductor devices. The semiconductor device may be encapsulated with the epoxy resin composition by a suitable method, e.g., transfer molding, injection molding, casting, and compression molding. In an implementation, the semiconductor device may be encapsulated with the epoxy resin composition by transfer molding at low pressure. In an implementation, the semiconductor device may be encapsulated with the epoxy resin composition by compression molding.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparative Example 1: Preparation of Epoxy Resin

An excess of a compound represented by Formula 5-2 was added to a compound represented by Formula 5-1, followed by reaction while stirring and heating to 110° C. Thereafter, the reaction product was cooled to ambient temperature, followed by removal of an unreacted residue of the compound represented by Formula 5-2 using a rotary evaporator (bath temperature: 50° C., pressure: 30 mbar). Thereafter, the resulting compound was dissolved in toluene, followed by heating to 80° C. Thereafter, an aqueous solution of NaOH was added to the resultant, followed by reaction, and then the reaction product was filtered through a filter, followed by removal of the remaining solvent using the rotary evaporator, thereby preparing an epoxy resin represented by Formula 5.

[Formula 5-1]

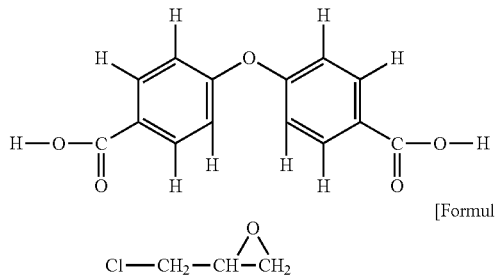

[Formula 5-2]

Cl—CH₂—CH—CH₂
         \O/

[Formula 5]

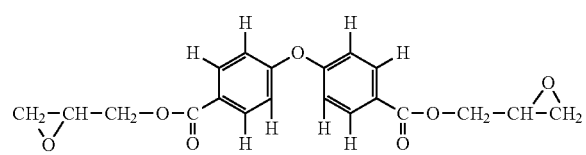

Preparative Example 2: Preparation of Epoxy Resin

An excess of the compound represented by Formula 5-2 was added to a compound represented by Formula 6-1, followed by reaction while heating to 110° C. Thereafter, the reaction product was cooled to ambient temperature, followed by removal of an unreacted residue of the compound represented by Formula 5-2 using a rotary evaporator (bath temperature: 50° C., pressure: 30 mbar). Thereafter, the resulting compound was dissolved in toluene, followed by heating to 80° C. Thereafter, an aqueous solution of NaOH was added to the resultant, followed by reaction, and then the reaction product was filtered through a filter, followed by removal of the remaining solvent using the rotary evaporator, thereby preparing an epoxy resin represented by Formula 6.

[Formula 6-1]

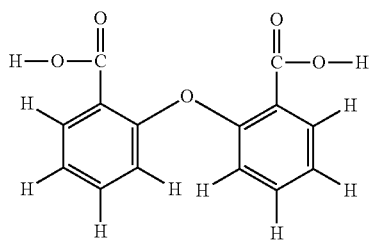

[Formula 6]

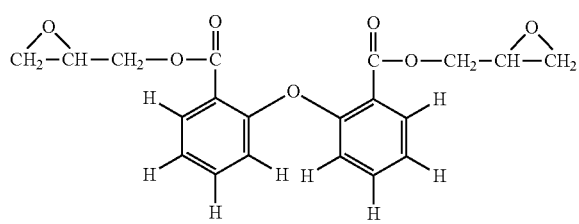

Details of components used in the Examples and Comparative Examples were as follows:

(A) Epoxy resin
(A1) The epoxy resin prepared in Preparative Example 1
(A2) The epoxy resin prepared in Preparative Example 2
(A3) NC-3000 (phenol aralkyl epoxy resin, Nippon Kayaku Co., Ltd.)
(A4) EPPN-501HY (polyfunctional epoxy resin, Nippon Kayaku Co., Ltd.)
(A5) An epoxy resin represented by Formula 7:

[Formula 7]

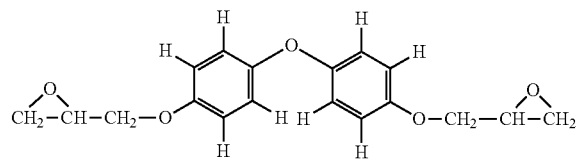

(B) Curing agent
(B1) KPH-F3065 (Xylok phenol resin, Kolon Chemical)
(B2) MEH-7851 (Phenol aralkyl resin, Meiwa Corporation)
(C) Curing catalyst: Triphenylphosphine (Hokko Chemical)
(D) Inorganic filler: A mixture of spherical fused alumina having an average particle diameter ($D_{50}$) of 20 μm and spherical fused alumina having an average particle diameter ($D_{50}$) of 0.5 μm (weight ratio: 9:1)
(E) Coupling agent
(E1) Methyltrimethoxysilane (SZ-6070, Dow Corning Corporation)

(E2) KBM-573 (N-phenyl-3-aminopropyltrimethoxysilane, Shinetsu Chemical)

(F) Carbon black (MA-600B, Mitsubishi Chemical)

Examples 1 to 5 and Comparative Examples 1 to 4

The aforementioned components were uniformly mixed in amounts (unit: parts by weight) listed in Table 1 in a Henschel mixer (KSM-22, KEUM SUNG MACHINERY Co., Ltd.) at 25° C. to 30° C. for 30 minutes, and then melt-kneaded in a continuous kneader at a temperature of up to 110° C. for 30 minutes, followed by cooling to 10° C. to 15° C. and pulverization, thereby preparing an epoxy resin composition for encapsulation of semiconductor devices. In Table 1, "-" means that a corresponding component was not used.

Each of the epoxy resin compositions prepared in Examples 1 to 5 and Comparative Examples 1 to 4 was evaluated as to the following properties. Results are shown in Table 1.

(1) Fluidity (unit: inch): Using a low-pressure transfer molding machine, each of the prepared epoxy resin compositions was injected into a mold for measurement of fluidity under conditions of a mold temperature of 175° C., a load of 70 kgf/cm$^2$, an injection pressure of 9 MPa; and a curing time of 90 seconds in accordance with EMMI-1-66, followed by measurement of flow length. A greater flow length indicates better fluidity.

(2) Thermal conductivity (unit: W/m·K): A specimen was prepared using each of the prepared epoxy resin compositions in accordance with ASTM D5470, followed by measurement of thermal conductivity of the specimen at 25° C.

(3) Semiconductor surface temperature (unit: ° C.): A semiconductor device for testing was mounted on a board and then connected to the board by wire bonding. Then, each of the prepared epoxy resin compositions was molded to a thickness of 500 μm onto the semiconductor device for testing at 175° C. for 120 seconds. Then, the resulting semiconductor package was placed in test equipment, and then the semiconductor device was operated for 1 hour by applying voltage thereto, followed by measurement of the temperature on the surface of the semiconductor package using a non-contact thermometer.

As may be in Table 1, the epoxy resin composition for encapsulation of semiconductor devices according to Examples 1-5 had good fluidity and exhibited good heat dissipation properties due to high thermal conductivity, thereby enabling the surface temperature of the semiconductor device in operation to be kept low.

Conversely, the compositions of the Comparative Examples, free from the epoxy resin represented by Formula 1, exhibited poor heat dissipation properties due to low thermal conductivity or exhibited poor moldability due to low fluidity.

By way of summation and review, in a semiconductor apparatus in which a multilayer high-density semiconductor device is encapsulated in a small and thin package, a failure such as cracking or malfunction of the package could occur due to heat generated from the semiconductor device in operation.

To address heat generation, a heatsink formed of a heat dissipation material such as a metal could be added to the semiconductor apparatus upon molding of an epoxy resin for encapsulation. However, such a heatsink may only be used in some packages such as a fine pitch ball grid array (FBGA) and a quad flat package (QFP) and may have a great expense and reduction in productivity due to the need for additional assembly processes. Therefore, an epoxy resin material for encapsulation of semiconductor devices may have high thermal conductivity and thus good heat dissipation capacity. Some semiconductor packages may use spherical aluminum oxide (alumina).

Alumina has a thermal conductivity of about 25 W/m·K to about 30 W/m·K. An epoxy resin included in an epoxy resin composition for encapsulation of semiconductor devices may have a very low thermal conductivity of 0.2 W/m·K, and it may be difficult to increase thermal conductivity of an encapsulation layer formed of the composition to more than 6W/m·K even using alumina. In addition, copper, aluminum, and silver particles have poor insulation performance despite having high thermal conductivity, and aluminum nitride, boron nitride, and silicon carbide filler may not ensure a high filler loading rate due to poor fluidity thereof despite having relatively good insulation performance. Although many successful cases regarding increase in thermal conductivity of

TABLE 1

| | | Example | | | | | Comparative Example | | | |
|---|---|---|---|---|---|---|---|---|---|---|
| | | 1 | 2 | 3 | 4 | 5 | 1 | 2 | 3 | 4 |
| A | A1 | 5.6 | 3.6 | 5.6 | 3.6 | — | — | — | — | — |
| | A2 | — | — | — | — | 5.6 | — | — | — | — |
| | A3 | — | — | — | — | — | 5.6 | 5.6 | — | — |
| | A4 | — | — | — | — | — | — | — | 5.6 | — |
| | A5 | — | — | — | — | — | — | — | — | 5.6 |
| B | B1 | 2 | 4 | — | — | 2 | 2 | — | 2 | 2 |
| | B2 | — | — | 2 | 4 | — | — | 2 | — | — |
| C | | 0.5 | 0.5 | 0.5 | 0.5 | 0.5 | 0.5 | 0.5 | 0.5 | 0.5 |
| D | | 91 | 91 | 91 | 91 | 91 | 91 | 91 | 91 | 91 |
| E | E1 | 0.2 | 0.2 | 0.2 | 0.2 | 0.2 | 0.2 | 0.2 | 0.2 | 0.2 |
| | E2 | 0.2 | 0.2 | 0.2 | 0.2 | 0.2 | 0.2 | 0.2 | 0.2 | 0.2 |
| F | | 0.5 | 0.5 | 0.5 | 0.5 | 0.5 | 0.5 | 0.5 | 0.5 | 0.5 |
| Fluidity | | 68 | 75 | 73 | 84 | 69 | 80 | 76 | 71 | 10 |
| Thermal conductivity | | 3.7 | 3.6 | 3.5 | 3.8 | 3.9 | 2.5 | 2.6 | 2.7 | 3.6 |
| Semiconductor surface temperature | | 35 | 37 | 38 | 33 | 32 | 80 | 75 | 73 | 37 | an epoxy resin have been reported in recent years, commercialization of a semiconductor material encapsulated with a compressed insulating thermosetting resin has not yet been achieved.

An epoxy resin composition for encapsulation of semiconductor devices may include an epoxy resin having better properties in terms of thermal conductivity and fluidity than conventional epoxy resins and may have high thermal conductivity and thus improved heat dissipation capacity, thereby suppressing heat-induced malfunction or defects of a semiconductor package.

One or more embodiments may provide an epoxy resin composition for encapsulation of semiconductor devices, which has good heat dissipation capacity due to high thermal conductivity while exhibiting good fluidity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An epoxy resin composition for encapsulation of semiconductor devices, the epoxy resin composition comprising:

an epoxy resin;

a curing agent;

an inorganic filler; and a curing catalyst, wherein:

the epoxy resin includes an epoxy resin represented by Formula 1:

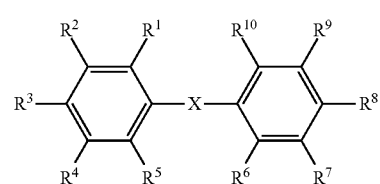

[Formula 1]

in Formula 1,

X is O, S, C(=O), a substituted or unsubstituted $C_1$ to $C_5$ alkylene group, or NH;

one of $R^1$, $R^2$, $R^3$, $R^4$, and $R^5$ is a group represented by Formula 2, and remaining ones of $R^1$, $R^2$, $R^3$, $R^4$, and $R^5$ are each independently hydrogen, a halogen, an amino group (—$NH_2$), a cyano group (—CN), a hydroxyl group (—OH), a substituted or unsubstituted $C_1$ to $C_{20}$ alkyl group, a substituted or unsubstituted $C_3$ to $C_{20}$ cycloalkyl group, a substituted or unsubstituted $C_6$ to $C_{20}$ aryl group, or a substituted or unsubstituted $C_7$ to $C_{20}$ arylalkyl group;

one of $R^6$, $R^7$, $R^8$, $R^9$, and $R^{10}$ is a group represented by Formula 2, remaining ones of $R^6$, $R^7$, $R^8$, $R^9$, and $R^{10}$ are each independently hydrogen, a halogen, an amino group, a cyano group, a hydroxyl group, a substituted or unsubstituted $C_1$ to $C_{20}$ alkyl group, a substituted or unsubstituted $C_3$ to $C_{20}$ cycloalkyl group, a substituted or unsubstituted $C_6$ to $C_{20}$ aryl group, or a substituted or unsubstituted $C_7$ to $C_{20}$ arylalkyl group,

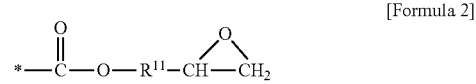

[Formula 2]

in Formula 2,

* is a linking site, and $R^{11}$ is a substituted or unsubstituted $C_1$ to $C_{10}$ alkylene group.

2. The epoxy resin composition as claimed in claim 1, wherein:

the epoxy resin represented by Formula 1 is represented by Formula 1-1, Formula 1-2, or Formula 1-3:

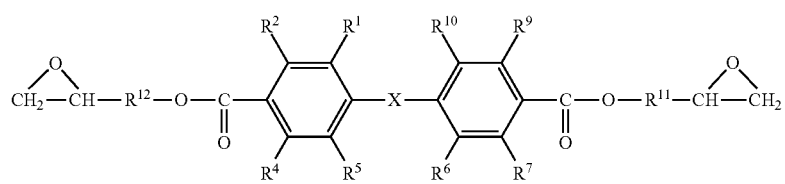

[Formula 1-1]

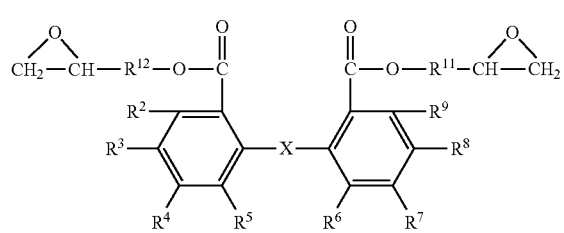

[Formula 1-2]

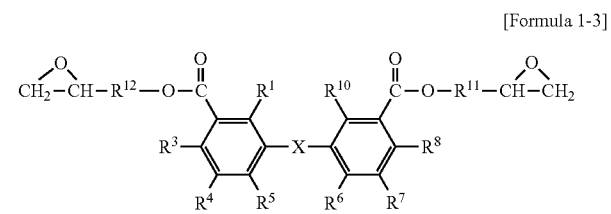

[Formula 1-3]

in Formulae 1-1, 1-2, and 1-3,

X is defined the same as that of Formula 1;

$R^{11}$ and $R^{12}$ are each independently a substituted or unsubstituted $C_1$ to $C_{10}$ alkylene group; and $R^1$, $R^2$, $R^3$, $R^4$, $R^5$, $R^6$, $R^7$, $R^8$, $R^9$, and $R^{10}$ are each independently hydrogen, a halogen, an amino group, a cyano group, a hydroxyl group, a substituted or unsubstituted $C_1$ to $C_{20}$ alkyl group, a substituted or unsubstituted $C_3$ to $C_{20}$ cycloalkyl group, a substituted or unsubstituted $C_6$ to $C_{20}$ aryl group, or a substituted or unsubstituted $C_7$ to $C_{20}$ arylalkyl group.

3. The epoxy resin composition as claimed in claim 2, wherein, in Formulae 1-1, 1-2, and 1-3, $R^1$, $R^2$, $R^3$, $R^4$, $R^5$, $R^6$, $R^7$, $R^8$, $R^9$, and $R^{10}$ are each independently hydrogen or a substituted or unsubstituted $C_1$ to $C_3$ alkyl group.

4. The epoxy resin composition as claimed in claim 1, wherein the epoxy resin represented by Formula 1 is present in the epoxy resin composition in an amount of about 2 wt % to about 17 wt %, based on a total weight of the epoxy resin composition.

5. The epoxy resin composition as claimed in claim 1, wherein the inorganic filler includes alumina.

6. The epoxy resin composition as claimed in claim 1, wherein the epoxy resin composition includes:

about 2 wt % to about 17 wt % of the epoxy resin;

about 0.5 wt % to about 13 wt % of the curing agent;

about 70 wt % to about 95 wt % of the inorganic filler; and about 0.01 wt % to about 5 wt % of the curing catalyst, all wt % being based on a total weight of the epoxy resin composition.

7. A semiconductor device encapsulated using the epoxy resin composition for encapsulation of semiconductor devices as claimed in claim 1.

\* \* \* \* \*